(12) United States Patent
Chi

(10) Patent No.: US 9,160,337 B2
(45) Date of Patent: Oct. 13, 2015

(54) SEMICONDUCTOR DEVICE

(71) Applicant: SK hynix Inc., Gyeonggi-do (KR)

(72) Inventor: Sung-Soo Chi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/279,487

(22) Filed: May 16, 2014

(65) Prior Publication Data

US 2015/0171867 A1    Jun. 18, 2015

(30) Foreign Application Priority Data

Dec. 12, 2013 (KR) .......................... 10-2013-0154758

(51) Int. Cl.
| | | |
|---|---|---|
| G11C 7/00 | (2006.01) |
| H03K 19/0175 | (2006.01) |
| G11C 7/10 | (2006.01) |
| G11C 8/08 | (2006.01) |
| G11C 11/408 | (2006.01) |

(52) U.S. Cl.
CPC .......... *H03K 19/0175* (2013.01); *G11C 7/1048* (2013.01); *G11C 7/1051* (2013.01); *G11C 8/08* (2013.01); *G11C 11/4085* (2013.01)

(58) Field of Classification Search
CPC ...... G11C 7/1048; G11C 7/1051; G11C 8/00; G11C 11/4085; H03K 19/018521; H03K 19/0175

USPC .............. 365/189.11, 189.12, 154, 156, 226; 327/333, 530; 326/62–63, 80
See application file for complete search history.

(56) References Cited

U.S. PATENT DOCUMENTS

| 5,019,727 | A | * | 5/1991 | Kusaba | ......................... 326/108 |
| 5,550,495 | A | * | 8/1996 | Fotouhi | ......................... 327/103 |
| 5,650,742 | A | * | 7/1997 | Hirano | ......................... 327/333 |
| 5,723,986 | A | * | 3/1998 | Nakashiro et al. | ............. 326/81 |
| 6,028,468 | A | * | 2/2000 | Menniti et al. | ................ 327/333 |
| 6,087,881 | A | * | 7/2000 | Chan et al. | ..................... 327/333 |

FOREIGN PATENT DOCUMENTS

KR    1020120120759    11/2012

* cited by examiner

*Primary Examiner* — Gene Auduong
(74) *Attorney, Agent, or Firm* — IP & T Group LLP

(57) ABSTRACT

A semiconductor device includes: a first level shifter suitable for shifting a level of a region identification signal identifying first and second regions to a preset voltage; a plurality of second level shifters suitable for shifting levels of a plurality of internal control signals to the preset voltage; and a plurality of logic operators suitable for generating a plurality of first internal assignment signals assigned to the first region and a plurality of second internal assignment signals assigned to the second region in response to a common shifting signal output from the first level shifter and a plurality of individual shifting signals output from the plurality of second level shifters.

13 Claims, 4 Drawing Sheets

SEMICONDUCTOR DEVICE

CROSS-REFERENCE TO RELATED APPLICATIONS

The present application claims priority to Korean Patent Application No. 10-2013-0154758, filed on Dec. 12, 2013, which is incorporated herein by reference in its entirety.

BACKGROUND

1. Field

Exemplary embodiments of the present invention relate to a semiconductor design technology, and more particularly, to a semiconductor device including a shifting circuit.

2. Description of the Related Art

A voltage level, which is externally supplied to a semiconductor device, is getting lower as power consumption of the semiconductor device becomes lower. Therefore, the semiconductor device includes a level shifting circuit capable of converting the externally supplied voltage having a preset level into an internal voltage having an appropriate level for internal circuits of the semiconductor device. For example, the level shifting circuit converts a signal having low voltage level into a signal having higher voltage level using a boosted voltage. Such a level shifting circuit serves as an interface for circuits using various voltage levels.

FIG. 1 is a block diagram illustrating a conventional semiconductor device.

Referring to FIG. 1, the conventional semiconductor device includes first to fifth level shifting circuits 10A to 10E corresponding to a first region (not shown) and sixth to tenth level shifting circuits 20A to 20E corresponding to a second region (not shown).

The first to fifth level shifting circuits 10A to 10E shifts levels of first to fifth internal control signals SAE1, SAE, SADRVPCGB, MATSEL and IOSWEN to one of first and second boosted voltage VPP and VPPY and generates first to fifth internal assignment signals SAP_L, SAN_L, SADRVPCG_L, BLEQ_L and IOSW_L in response to a first region identification signal LAXF<0>.

For example, the first level shifting circuit 10A includes a first input section 10A_1, a first level shifter 10_3 and a first output section 10A_5. The first input section 10A_1 selectively receives a pull-up enable signal SAE1 in response to the first region identification signal LAXF<0>. The first level shifter 10A_3 shifts level of the output signal of the first input section 10A_1 to the first boosted voltage VPP. The first output section 10A_5 outputs the output signal of the first level shifter 10A_3 as the first pull-up driving signal SAP_L.

The second level shifting circuit 10B includes a second input section 10B_1, a second level shifter 10B_3 and a second output section 10B_5. The second input section 10B_1 selectively receives a pull-down enable signal SAE in response to the first region identification signal LAXF<0>. The second level shifter 10B_3 shifts level of the output signal of the second input section 10B_1 to the second boosted voltage VPPY. The second output section 10B_5 outputs the output signal of the second level shifter 10B_3 as the first pull-down driving signal SAN_L.

The third level shifting circuit 10C includes a third input section 10C_1, a third level shifter 10C_3 and a third output section 10C_5. The third input section 10C_1 selectively receives a control signal SADRVPCGB for sensing and amplifying in response to the first region identification signal LAXF<0>. The third level shifter 10C_3 shifts level of the output signal of the third input section 10C_1 to the second boosted voltage VPPY. The third output section 10C_5 outputs the output signal of the third level shifter 10C_3 as the first precharge signal SADRVPCG_L for sensing and amplifying.

The fourth level shifting circuit 10D includes a fourth input section 10D_1, a fourth level shifter 10D_3 and a fourth output section 10D_5. The fourth input section 10D_1 selectively receives a mat selection signal MATSEL in response to the first region identification signal LAXF<0>. The fourth level shifter 10D_3 shifts level of the output signal of the fourth input section 10D_1 to the second boosted voltage VPPY. The fourth output section 10D_5 outputs the output signal of the fourth level shifter 10D_3 as the first precharge signal BLEQ_L.

The fifth level shifting circuit 10E includes a fifth input section 10E_1, a fifth level shifter 10E_3 and a fifth output section 10E_5. The fifth input section 10E_1 selectively receives an enable signal IOSWEN for switching in response to the first region identification signal LAXF<0>. The fifth level shifter 10E_3 shifts level of the output signal of the fifth input section 10E_1 to the second boosted voltage VPPY. The fifth output section 10E_5 outputs the output signal of the fifth level shifter 10E_3 as the first switching signal IOSW_L.

The sixth to tenth level shifting circuits 20A to 20E shifts levels of the first to fifth internal control signals SAE1, SAE, SADRVPCGB, MATSEL and IOSWEN to one of the first and second boosted voltage VPP and VPPY and generates sixth to tenth internal assignment signals SAP_R, SAN_R, SADRVPCG_R, BLEQ_R and IOSW_R in response to a second region identification signal LAXF<1>.

For example, the sixth level shifting circuit 20A includes a sixth input section 20A_1, a sixth level shifter 20A_3 and a sixth output section 20A_5. The sixth input section 20A_1 selectively receives the pull-up enable signal SAE1 in response to the second region identification signal LAXF<1>. The sixth level shifter 20A_3 shifts level of the output signal of the sixth input section 20A_1 to the first boosted voltage VPP. The sixth output section 20A_5 outputs the output signal of the sixth level shifter 20A_3 as the second pull-up driving signal SAP_R.

The seventh level shifting circuit 20B includes a seventh input section 20B_1, a seventh level shifter 20B_3 and a seventh output section 20B_5. The seventh input section 20B_1 selectively receives the pull-down enable signal SAE in response to the second region identification signal LAXF<1>. The seventh level shifter 20B_3 shifts level of the output signal of the seventh input section 20B_1 to the second boosted voltage VPPY. The seventh output section 20B_5 outputs the output signal of the seventh level shifter 20B_3 as the second pull-down driving signal SAN_R.

The eighth level shifting circuit 20C includes an eighth input section 20C_1, an eighth level shifter 20C_3 and an eighth output section 20C_5. The eighth input section 20C_1 selectively receives the control signal SADRVPCGB for sensing and amplifying in response to the second region identification signal LAXF<1>. The eighth level shifter 20C_3 shifts level of the output signal of the eighth input section 20C_1 to the second boosted voltage VPPY. The eighth output section 20C_5 outputs the output signal of the eighth level shifter 20C_3 as the second precharge signal SADRVPCG_R for sensing and amplifying.

The ninth level shifting circuit 20D includes a ninth input section 20D_1, a ninth level shifter 20D_3 and a ninth output section 20D_5. The ninth input section 20D_1 selectively receives the mat selection signal MATSEL in response to the second region identification signal LAXF<1>. The ninth level shifter 20D_3 shifts level of the output signal of the ninth input section 20D_1 to the second boosted voltage VPPY. The ninth output section 20D_5 outputs the output signal of the ninth level shifter 20D_3 as the second precharge signal BLEQ_R.

The tenth level shifting circuit 20E includes a tenth input section 20E_1, a tenth level shifter 20E_3 and a tenth output section 20E_5. The tenth input section 20E_1 selectively receives the enable signal IOSWEN for switching in response to the second region identification signal LAXF<1>. The tenth level shifter 20E_3 shifts level of the output signal of the tenth input section 20E_1 to the second boosted voltage VPPY. The tenth output section 20E_5 outputs the output signal of the tenth level shifter 20E_3 as the second switching signal IOSW_R.

Operation of the conventional semiconductor device is described as follows.

When the first region identification signal LAXF<0> is enabled, the first to fifth level shifting circuits 10A to 10E shifts levels of first to fifth internal control signals SAE1, SAE, SADRVPCGB, MATSEL and IOSWEN to one of first and second boosted voltage VPP and VPPY and outputs the level-shifted signal's as the first to fifth internal assignment signals SAP_L, SAN_L, SADRVPCG_L, BLEQ_L and IOSW_L.

A first internal circuit (not shown) located in the first region performs a preset operation in response to the first to fifth internal assignment signals SAP_L, SAN_L, SADRVPCG_L, BLEQ_L and IOSW_L. For example, the first internal circuit performs a write operation to write into a memory cell, data externally input or performs a read operation to read out data written in the memory cell to the external in response to the first to fifth internal assignment signals SAP_L, SAN_L, SADRVPCG_L, BLEQ_L and IOSW_L.

When the second region identification signal LAXF<1> is enabled, the sixth to tenth level shifting circuits 20A to 20E shifts levels of the first to fifth internal control signals SAE1, SAE, SADRVPCGB, MATSEL and IOSWEN to one of the first and second boosted voltage VPP and VPPY and outputs the level-shifted signals as the sixth to tenth internal assignment signals SAP_R, SAN_R, SADRVPCG_R, BLEQ_R and IOSW_R.

A second internal circuit (not shown) located in the second region performs a preset operation in response to the sixth to tenth internal assignment signals SAP_R, SAN_R, SADRVPCG_R, BLEQ_R, IOSW_R. For example, the second internal circuit performs a write operation to write into a memory cell data externally input or performs a read operation to read out data written in the memory cell to the external in response to the sixth to tenth internal assignment signals SAP_R, SAN_R, SADRVPCG_R, BLEQ_R and IOSW_R.

There is a problem in such conventional semiconductor device as follows.

The conventional semiconductor device includes the first to tenth level shifting circuits 10A to 10E and 20A to 20E to generate the first to tenth internal assignment signals SAP_L, SAN_L, SADRVPCG_L, BLEQ_L, IOSW_L, SAP_R, SAN_R, SADRVPCG_R, BLEQ_R and IOSW_R, which means that the conventional semiconductor device includes one level shifting circuit per one internal assignment signal. This is due to the first to fifth internal assignment signals SAP_L, SAN_L, SADRVPCG_L, BLEQ_L and IOSW_L being assigned to the first region while the sixth to tenth internal assignment signals SAP_R, SAN_R, SADRVPCG_R, BLEQ_R and IOSW_R are assigned to the second region even though the first to fifth internal assignment signals SAP_L, SAN_L, SADRVPCG_L, BLEQ_L and IOSW_L and the sixth to tenth internal assignment signals SAP_R, SAN_R, SADRVPCG_R, BLEQ_R and IOSW_R are respectively similar to each other.

Such a conventional semiconductor device needs a great amount of space for a plurality level shifting circuits 10A to 10E and 20A to 20E to be disposed therein according to regions.

SUMMARY

Various embodiments of the present invention are directed to a semiconductor device in which a plurality of level shifting circuits may be shared.

In accordance with an embodiment of the present invention, a semiconductor device may include: a first level shifter suitable for shifting a level of a region identification signal identifying first and second regions to a preset voltage; a plurality of second level shifters suitable for shifting levels of a plurality of internal control signals to the preset voltage; and a plurality of logic operators suitable for generating a plurality of first internal assignment signals assigned to the first region and a plurality of second internal assignment signals assigned to the second region in response to a common shifting signal output from the first level shifter and a plurality of individual shifting signals output from the plurality of second level shifters.

In accordance with an embodiment of the present invention, a semiconductor device may include: a first common level shifter suitable for shifting a level of a first region identification signal corresponding to a first region to a preset voltage; a second common level shifter suitable for shifting a level of a second region identification signal corresponding to a second region to the preset voltage; a plurality of individual level shifters suitable for shifting levels of a plurality of internal control signals to the preset voltage; a plurality of logic operators suitable for generating a plurality of first internal assignment signals assigned to the first region and a plurality of second internal assignment signals assigned to the second region by performing a logic operation on first and second common shifting signals output from the first and second common level shifters and a plurality of individual shifting signals respectively output from the plurality of second level shifters; a first internal circuit disposed in the first region and suitable for performing a preset operation in response to the plurality of first internal assignment signals; and a second internal circuit disposed in the second region and suitable for performing a preset operation in response to the plurality of second internal assignment signals.

A plurality of level shifting circuits may be shared in the semiconductor device in accordance with the present invention and thus size of the semiconductor device may be reduced.

DETAILED DESCRIPTION

Figure 1:
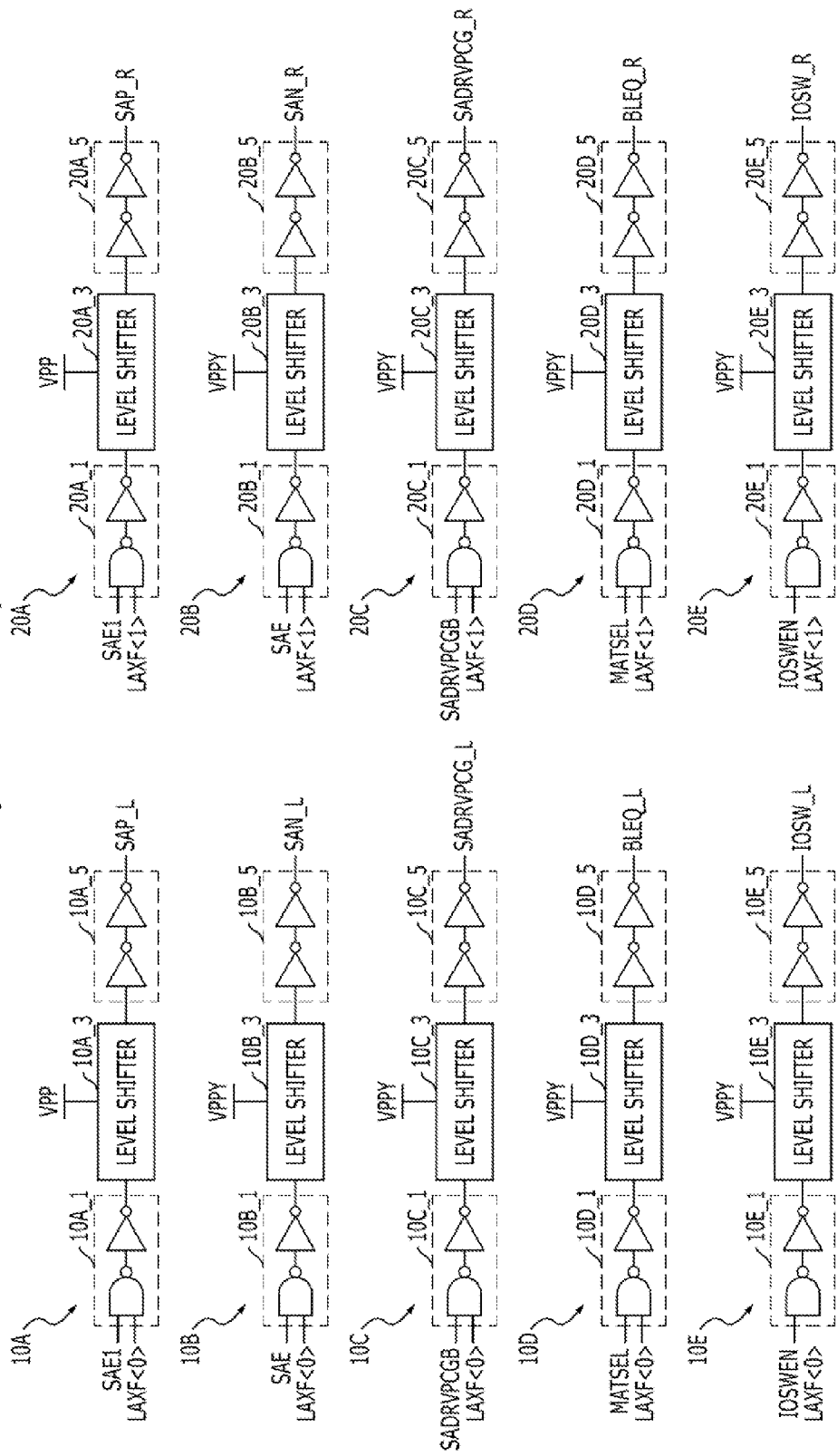
FIG. 1 is a block diagram illustrating a conventional semiconductor device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. The drawings are not necessarily to scale and in some instances, proportions may have been exaggerated in order to clearly illustrate features of the embodiments. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to a case where the first layer is formed directly on the second layer or the substrate but also a case where a third layer exists between the first layer and the second layer or the substrate.

In the description, a dynamic random access memory (DRAM) device is used as an example of the semiconductor device.

Figure 2:
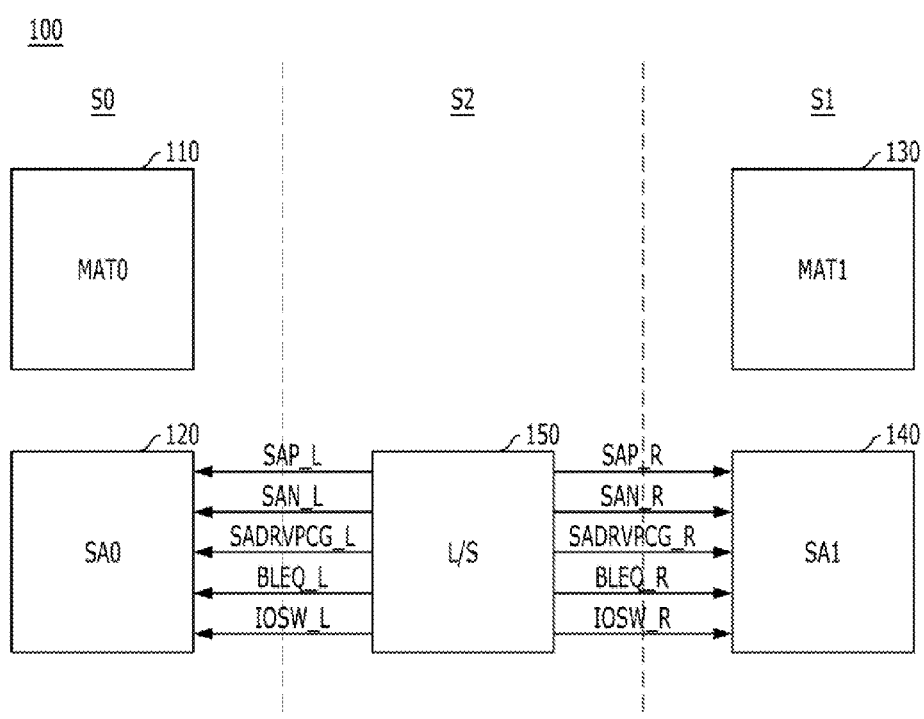
FIG. 2 is a block diagram illustrating a semiconductor device in accordance with the present invention.

FIG. 2 is a block diagram illustrating a semiconductor device in accordance with the present invention.

Referring to FIG. 2, the semiconductor device 100 may include first to third regions S0 to S2. The first region S0 may include a first MAT0 110 for a first data to be written into or read out from, and a first data input/output path circuit 120 suitable for providing write and read paths for the first data. The second region S1 may include a second MAT1 130 for a second data to be written into or read out from, and a second data input/output path circuit 140 suitable for providing write and read paths for the second data. The third region S2 may be disposed between the first and second regions S0 and S1 and include a control circuit 150 suitable for controlling the first and second data input/output path circuits 120 and 140.

The control circuit 150 may generate the first to fifth internal assignment signals SAP_L, SAN_L, SADRVPCG_L, BLEQ_L_ and IOSW_L for controlling the first data input/output path circuit 120 and the sixth to tenth internal assignment signals SAP_R, SAN_R, SADRVPCG_R, BLEQ_R and IOSW_R for controlling the second data input/output path circuit 140.

Figure 3:
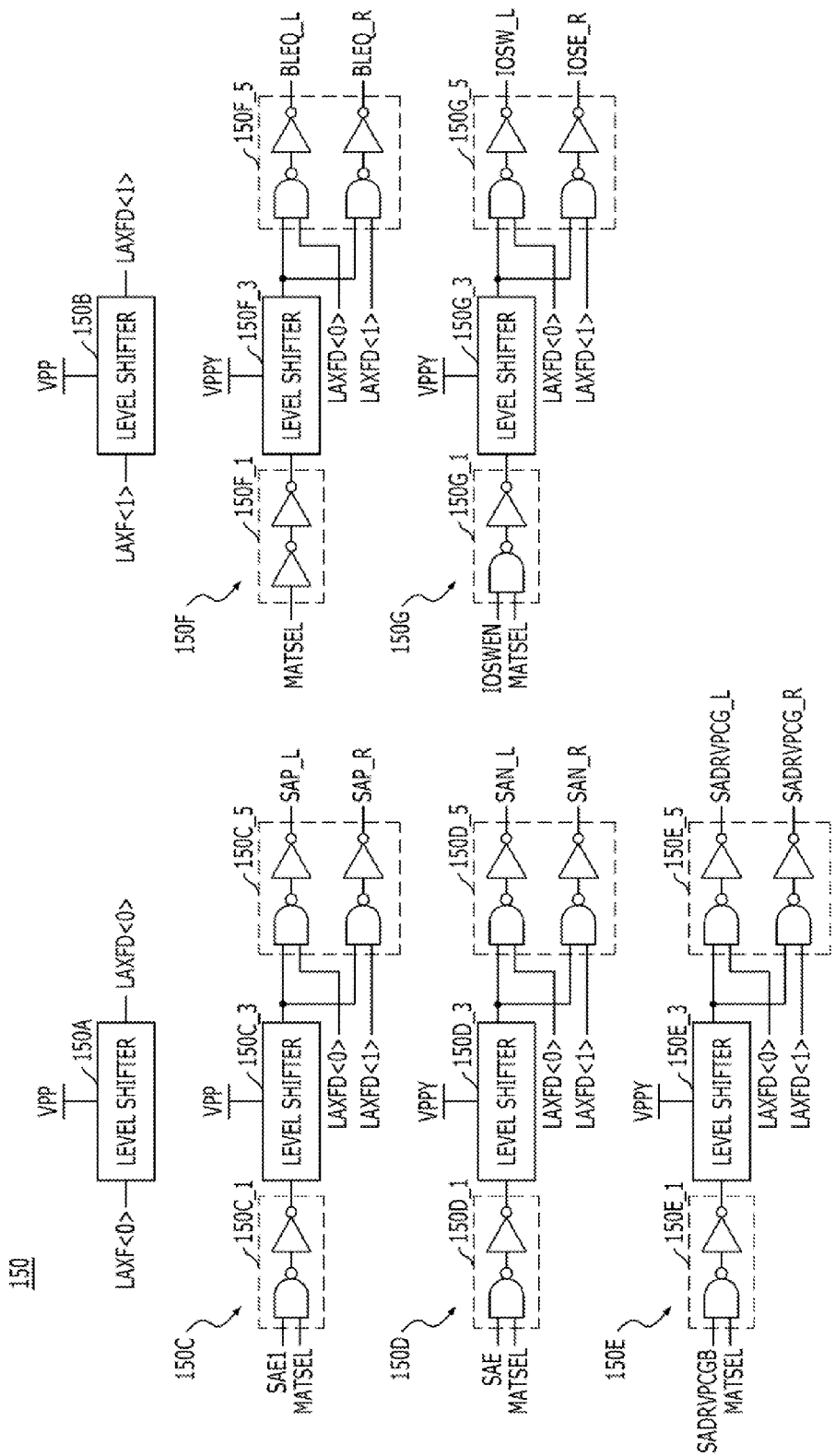
FIG. 3 is a block diagram illustrating a part of a control' circuit disposed in a third region shown in FIG. 2.

FIG. 3 is a block diagram illustrating a part of the control circuit 150 disposed in the third region S2 shown in FIG. 2.

Referring to FIG. 3, the control circuit 150 may include a first common level shifter 150A, a second common level shifter 150B and first and fifth level shifting units 150C, 150D, 150E, 150F and 150G. The first common level shifter 150A may generate a first common shifting signal LAXFD<0> by shifting a level of the first region identification signal LAXF<0> corresponding to the first region S0 to the first boosted voltage VPP. The second common level shifter 150B may generate a second common shifting signal LAXFD<1> by shifting a level of the second region identification signal LAXF<1> corresponding to the second region S1 to the first boosted voltage VPP. The first and fifth level shifting units 150C, 150D, 150E, 150F and 150G may generate the first to tenth internal assignment signals SAP_L, SAN_L, SADRVPCG_L, BLEQ_L, IOSW_L, SAP_R, SAN_R, SADRVPCG_R, BLEQ_R and IOSW_R by shifting levels of the first to fifth internal control signals SAE1, SAE, SADRVPCGB, MATSEL and IOSWEN to one of the first boosted voltage VPP and the second boosted voltage VPPY.

The first and second region identification signals LAXF<0> and LAXF<1> may be used for selecting one of the first and second regions S0 and S1. For example, the first and second region identification signals LAXF<0> and LAXF<1> may include first and second bank addresses for identifying first and second banks, respectively. The first to fifth internal assignment signals SAP_L, SAN_L, SADRVPCG_L, BLEQ_L and IOSW_L may include the first pull-up driving signal, the first pull-down driving signal, the first precharge signal for sensing and amplifying, the first precharge signal and the first switching signal. The sixth to tenth internal assignment signals SAP_R, SAN_R, SADRVPCG_R, BLEQ_R and IOSW_R may include the second pull-up driving signal, the second pull-down driving signal, the second precharge signal for sensing and amplifying, the second precharge signal and the second switching signal.

Hereinafter, the first to tenth internal assignment signals SAP_L, SAN_L, SADRVPCG_L, BLEQ_L, SAP_R, SAN_R, SADRVPCG_R, BLEQ_R and IOSW_R may be referred to as the first pull-up driving signal, the first pull-down driving signal, the first precharge signal for sensing and amplifying, the first precharge signal, the first switching signal, the second pull-up driving signal, the second pull-down driving signal, the second precharge signal for sensing and amplifying, the second precharge signal and the second switching signal, respectively.

The first level shifting unit 150C may include a first input section 150C_1, a first individual level shifter 150C_3 and a first logic operator 150C_5. The first input section 150C_1 may selectively receive the first internal assignment signal SAE1 in response to the mat selection signal MATSEL. The first individual level shifter 150C_3 may shift level of the output signal of the first input section 150C_1 to the first boosted voltage VPP. The first logic operator 150C_5 may generate the first and second pull-up driving signals SAP_L and SAP_R by performing logic operations on the first and second common shifting signals LAXFD<0> and LAXFD<1> and the output signal of the first individual level shifter 150C_3. The first input section 150C_1 may include a NAND gate for performing NAND operations on the first internal assignment signal SAE1 and the mat selection signal MATSEL, and include an inverter for inverting the output signal of the NAND gate. The first logic operator 150C_5 may include a NAND gate for performing NAND operations on the first common shifting signal LAXFD<0> and the output signal of the first individual level shifter 150C_3, include an inverter for outputting the first pull-up driving signal SAP_L by inverting the output signal of the NAND gate, include a NAND gate for performing NAND operations on the second common shifting signal LAXFD<1> and the output signal of the first individual level shifter 150C_3, and include an inverter for outputting the second pull-up driving signal SAP_R by inverting the output signal of the NAND gate.

The second level shifting unit 150D may include a second input section 150D_1, a second individual level shifter 150D_3 and a second logic operator 150D_5. The second input section 150D_1 may selectively receive the second internal assignment signal SAE in response to the mat selection signal MATSEL. The second individual level shifter 150D_3 may shift a level of the output signal of the second input section 150D_1 to the second boosted voltage VPPY. The second logic operator 150C_5 may generate the first and second pull-down driving signals SAN_ and SAN_R by performing logic operations on the first and second common shifting signals LAXFD<0> and LAXFD<1> and the output signal of the second individual level shifter 150D_3. The second input section 150D_1 may include a NAND gate for performing NAND operations on the second internal assignment signal SAE and the mat selection signal MATSEL, and include an inverter for inverting the output signal of the NAND gate. The second logic operator 150D_5 may include a NAND gate for performing NAND operations on the first common shifting signal LAXFD<0> and the output signal of the second individual level shifter 150D_3, include an inverter for outputting the first pull-down driving signal SAN_L by inverting the output signal of the NAND gate, include a NAND gate for performing NAND operations on the second common shifting signal LAXFD<1> and the output signal of the second individual level shifter 150D_3, and include an inverter for outputting the second pull-down driving signal SAN_R by inverting the output signal of the NAND gate.

The third level shifting unit 150E may include a third input section 150E_1 a third individual level shifter 150E_3 and a third logic operator 150E_5. The third input section 150E_1 may selectively receive the third internal assignment signal SADRVPCGB in response to the mat selection signal MATSEL. The third individual level shifter 150E_3 may shift a level of the output signal of the third input section 150E_1 to the second boosted voltage VPPY. The third logic operator 150E_5 may generate the first and second precharge signals SADRVPCG_L and SADRVPCG_R for sensing and amplifying by performing logic operations on the first and second common shifting signals LAXFD<0> and LAXFD<1> and the output signal of the third individual level shifter 150E_3. The third input section 150E_1 may include a NAND gate for performing NAND operations on the third internal assignment signal SADRVPCGB and the mat selection signal MATSEL, and include an inverter for inverting the output signal of the NAND gate. The third logic operator 150E_5 may include a NAND gate for performing NAND operation on the first common shifting signal LAXFD<0> and the output signal of the third individual level shifter 150E_3, include an inverter for outputting the first precharge signal SADRVPCG_L for sensing and amplifying by inverting the output signal of the NAND gate, include a NAND gate for performing NAND operation on the second common shifting signal LAXFD<1> and the output signal of the third individual level shifter 150E_3, and include an inverter for outputting the second precharge signal SADRVPCG_R for sensing and amplifying by inverting the output signal of the NAND gate.

The fourth level shifting unit 150F may include a fourth input section 150F_1 a fourth individual level shifter 150F_3 and a fourth logic operator 150F_5. The fourth input section 150F_1 may receive the fourth internal assignment signal MATSEL. The fourth individual level shifter 150F_3 may shift level of the output signal of the fourth input section 150F_1 to the second boosted voltage VPPY. The fourth logic operator 150F_5 may generate the first and second precharge signals BLEQ_L and BLEQ_R by performing logic operations on the first and second common shifting signals LAXFD<0> and LAXFD<1> and the output signal of the fourth individual level shifter 150F_3. The fourth input section 150F_1 may include two inverters serially coupled. The fourth logic operator 150F_5 may include a NAND gate for performing NAND operations on the first common shifting signal LAXFD<0> and the output signal of the fourth individual level shifter 150F_3, include an inverter for outputting the first precharge signal BLEQ_L by inverting the output signal of the NAND gate, include a NAND gate for performing NAND operations on the second common shifting signal LAXFD<1> and the output signal of the fourth individual level shifter 150F_3, and include an inverter for outputting the second precharge signal BLEQ_R by inverting the output signal of the NAND gate.

The fifth level shifting unit 150G may include a fifth input section 150G_1, a fifth individual level shifter 150G_3 and a fifth logic operator 150G_5. The fifth input section 150G_1 may selectively receive the fifth internal assignment signal IOSWEN in response to the mat selection signal MATSEL. The fifth individual level shifter 150G_3 may shift a level of the output signal of the fifth input section 150G_1 to the second boosted voltage VPPY. The fifth logic operator 150F_5 may generate the first and second switching signals IOSW_L and IOSW_R by performing logic operations on the first and second common shifting signals LAXFD<0> and LAXFD<1> and the output signal of the fifth individual level shifter 150G_3. The fifth input section 150G_1 may include a NAND gate for performing NAND operations on the fifth internal assignment signal IOSWEN and the mat selection signal MATSEL, and include an inverter for inverting the output signal of the NAND gate. The fifth logic operator 150G_5 may include a NAND gate for performing NAND operations on the first common shifting signal LAXFD<0> and the output signal of the fifth individual level shifter 150G_3, include an inverter for outputting the first switching signal IOSW_L by inverting the output signal of the NAND gate, include a NAND gate for performing NAND operations on the second common shifting signal LAXFD<1> and the output signal of the fifth individual level shifter 150G_3, and include an inverter for outputting the second switching signal IOSW_R by inverting the output signal of the NAND gate.

The first boosted voltage VPP and the second boosted voltage VPPY may have the same level or of different level to each other.

Figure 4:
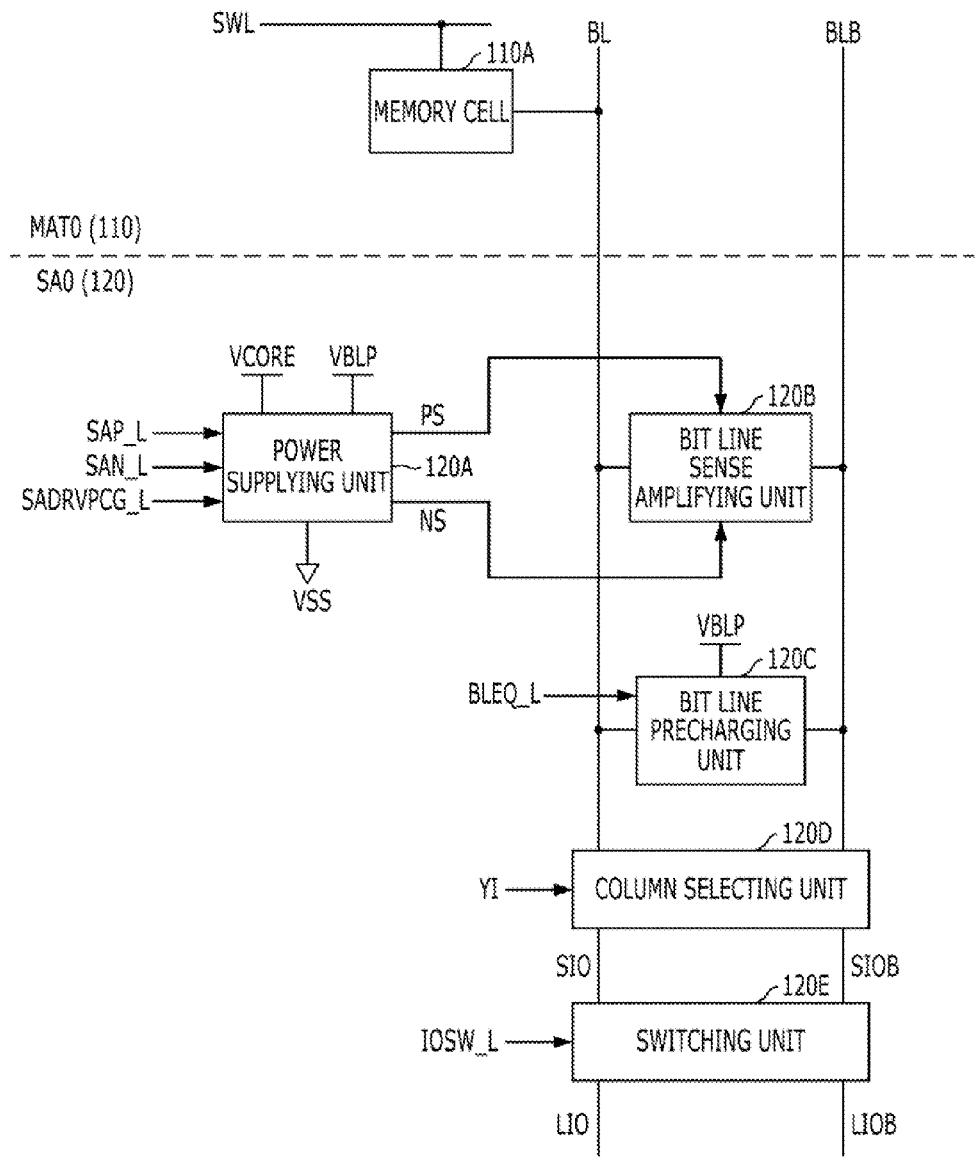
FIG. 4 is a block diagram illustrating a first MAT and a part of a first data input/output path disposed in a first region shown in FIG. 2.

FIG. 4 is a block diagram illustrating the first MAT0 110 and a part of the first data input/output path circuit 120 disposed in the first region S0 shown in FIG. 2.

It is noted that FIG. 4 depicts only the first MAT0 110 and a part of the first data input/output path circuit 120.

Referring to FIG. 4, the first MAT0 110 may be coupled to a word line SWL and a bit line BL and may include a memory cell 110A, into which a data on the bit line BL is written, and from which a written data is read out to the bit line BL when the word line SWL is activated.

The first data input/output path circuit 120 may include a power supply unit 120A, a bit line sense amplifying unit 120B, a bit line precharging unit 120C, a column selecting unit 120D and a switching unit 120E. The power supply unit 120A may provide a core voltage VCORE or a bit line precharge voltage VBLP to a pull-up terminal PS and a ground voltage VSS of the bit line precharge voltage VBLP to a pull-down terminal NS in response to the first pull-up driving signal SAP_L, the first pull-down driving signal SAN_L and the first precharge signal SADRVPCG_L, for sensing and amplifying. The bit line sense amplifying unit 120B may be coupled between the pull-up terminal PS and the pull-down terminal NS and may sense and amplify a data on the pair of bit lines BL and BLB. The bit line precharging unit 120C may precharge the pair of bit lines BL and BLB to a level of the bit line precharge voltage VBLP in response to the first precharge signal BLEQ_L. The column selecting unit 120D may selectively couple the pair of bit lines BL and BLB to a pair of segment lines SIO and SIOB in response to a column selection signal YI. The switching unit 120E may selectively couple the pair of segment lines SIO and SIOB to a pair of local lines LIO and LIB in response to the first switching signal IOSW_L.

The power supply unit 120A may drive the pull-up terminal PS to a level of the core voltage VCORE and drive the pull-down terminal NS to level of the ground voltage VSS in response to the first pull-up driving signal SAP_L and the first pull-down driving signal SAN_L, which are activated during the active mode. The power supply unit 120A may drive the pull-up terminal PS and the pull-down terminal NS to a level of the bit line precharge voltage VBLP in response to the first precharge signal SADRVPCG_L for sensing and amplifying, which is activated during the standby mode.

The bit line sense amplifying unit 120B may sense and amplify data on the pair of bit lines BL and BLB in the active mode and may be disabled in the standby mode.

The bit line precharging unit 120C may precharge the pair of bit lines BL and BLB to a level of the bit line precharge voltage VBLP in the standby mode.

The column selecting unit 120D may electrically couple the pair of bit lines BL and BLB to the pair of segment lines SIO and SIOB in the active mode.

The switching unit 120E may electrically couple the pair of segment lines SIO and SIOB to the pair of local lines LIO and LIB.

The second MAT1 130 and the second data input/output path circuit 140 shown in FIG. 2 are the same as the first MAT0 110 and the first input/output path circuit 120 described above.

Hereinafter operation of such semiconductor device 100 in accordance with the present invention is described.

Referring to FIGS. 2, 3 and 4, the control circuit 150 may enable one or more of the first and second data input/output path circuits 120 and 140 according to activation of the first and second region identification signals LAXF<0> and LAXF<1>. For example, the control circuit 150 may enable the first data input/output path circuit 120 when the first region identification signal LAXF<0> is activated. The control circuit 150 may enable the second data input/output path circuit 140 when the second region identification signal LAXF<1> is activated. The control circuit 150 may enable the first and second data input/output path circuits 120 and 140 when the first and second region identification signals LAXF<0> and LAXF<1> are activated.

Hereinafter operation of the control circuit 150 and the first and second data input/output path circuits 120 and 140, in each of the active mode and the standby mode is described.

Operation of the control circuit 150 and the first and second data input/output path circuits 120 and 140, in the active mode is described.

The control circuit 150 may control the first and second data input/output path circuits 120 and 140 to perform write operations or read operations. Operation of the control circuit 150 according to activation of the first and second region identification signals LAXF<0> and LAXF<1>, relating to the write operation or the read operation will be described.

When the first region identification signal LAXF<0> is activated, the first common level shifter 150A activates the first common shifting signal LAXFD<0> by shifting a level of the first region identification signal LAXF<0> to the first boosted voltage VPP, the first level shifting unit 150C may activate the first pull-up driving signal SAP_L between the first and second pull-up driving signals SAP_L and SAP_R in response to the first common shifting signal LAXFD<0>, the first internal control signal SAE1 and the mat selection signal MATSEL. When the first common level shifter 150A activates the first common shifting signal LAXFD<0> by shifting a level of the first region identification signal LAXF<0> to the first boosted voltage VPP, the second level shifting unit 150D may activate the first pull-down driving signal SAN_L between the first and second pull-down driving signals SAN_L and SAN_R in response to the first common shifting signal LAXFD<0> the second internal control signal SAE and the mat selection signal MATSEL. When the first common level shifter 150A activates the first common shifting signal LAXFD<0> by shifting a level of the first region identification signal LAXF<0> to the first boosted voltage VPP, the fifth level shifting unit 150G may activate the first switching signal IOSW_L between the first and second switching signals IOSW_L and IOSW_R in response to the first common shifting signal LAXFD<0>, the fifth internal control signal IOSWEN and the mat selection signal MATSEL.

Where the second region identification signal LAXF<1> is activated, the second common level shifter 1506 activates the second common shifting signal LAXFD<1> by shifting a level of the second region identification signal LAXF<1> to the first boosted voltage VPP, the first level shifting unit 150C may activate the second pull-up driving signal SAP_R between the first and second pull-up driving signals SAP_L and SAP_R in response to the second common shifting signal LAXFD<1>, the first internal control signal SAE1 and the mat selection signal MATSEL. When the second common level shifter 150B activates the second common shifting signal LAXFD<1> by shifting a level of the second region identification signal LAXF<1> to the first boosted voltage VPP, the second level shifting unit 150D may activate the second pull-down driving signal SAN_R between the first and second pull-down driving signals SAN_L and SAN_R in response to the second common shifting signal LAXFD<1> the second internal control signal SAE and the mat selection signal MATSEL. When the second common level shifter 150B activates the second common shifting signal LAXFD<1> by shifting a level of the second region identification signal LAXF<1> to the first boosted voltage VPP, the fifth level shifting unit 150G may activate the second switching signal IOSW_R between the first and second switching signals IOSW_L and IOSW_R in response to the second common shifting signal LAXFD<1>, the fifth internal control signal IOSWEN and the mat selection signal MATSEL When the first and second region identification signals LAXF<0> and LAXF<1> are activated, the first and second common level shifting units 150A and 150B activate both of the first and second common shifting signals LAXFD<0> and LAXFD<1> by shifting levels of the first and second region identification signals LAXF0> and LAXF<1> to the first boosted voltage VPP, the first level shifting unit 150C may activate both of the first and second pull-up driving signals SAP_L and SAP_R in response to the first and second common shifting signals LAXFD<0> and LAXFD<1>, the first internal control signal SAE1 and the mat selection signal MATSEL. When the first and second common level shifting units 150A and 150B activate both of the first and second common shifting signals LAXFD<0> and LAXFD<1> by shifting levels of the first and second region identification signals LAXF<0> and LAXF<1> to the first boosted voltage VPP, the second level shifting unit 150D may activate both of the first and second pull-down driving signals SAN_L and SAN_R in response to the first and second common shifting signals LAXFD<0> and LAXFD<1>, the second internal control signal SAE and the mat selection signal MATSEL. When the first and second common level shifting units 150A and 150B activate both of the first and second common shifting signals LAXFD<0> and LAXFD<1> by shifting levels of the first and second region identification signals LAXF<0> and LAXF<1> to the first boosted voltage VPP, the fifth level shifting unit 150G may activate both of the first and second switching signals IOSW_L and IOSW_R in response to the first and second common shifting signals LAXFD<0> and LAXFD<1>, the fifth internal control signal IOSWEN and the mat selection signal MATSEL.

Then, the first data input/output path circuit 120 may perform write or read operations under the control of the control circuit 150. The operation of the first data input/output path circuit 120, may be described as the power supply unit 120A may drive the pull-up terminal PS with the core voltage VCORE in response to the first pull-up driving signal SAP_L, and may drive the pull-down terminal NS with the ground voltage VSS in response to the first pull-down driving signal SAN_L. The bit line sense amplifying unit 120B may sense and amplify the first data on the pair of bit lines BL and BLB. The column selecting unit 120D may electrically couple the pair of bit lines BL and BLB to the pair of segment lines SIO and SIOB in response to a column selection signal YI. The switching unit 120E may electrically couple the pair of segment lines 510 and SIOB to the pair of local lines LIO and LIB. Therefore, the first data input from the external may be provided to the first MAT0 110 or the first data provided from the first MAT0 110 may be output to the external.

Write operations and read operations of the second data input/output path circuit 140 are the same as the first data input/output path circuit 120.

Next, an operation of the control circuit 150 and the first and second data input/output path circuits 120 and 140, in the standby mode is described.

The control circuit 150 may control the first and second data input/output path circuits 120 and 140 to perform precharge operations. Operation of the control circuit 150 according to activation of the first and second region identification signals LAXF<0> and LAXF<1>, relating to the precharge operation will be described.

Where the first region identification signal LAXF<0> is activated, the first common level shifter 150A activates the first common shifting signal LAXFD<0> by shifting a level of the first region identification signal LAXF<0> to the first boosted voltage VPP, the third level shifting unit 150E may activate the first precharge signal SADRVPCG_L for sensing and amplifying between the first and second precharge signals SADRVPCG_L and SADRVPCG_R for sensing and amplifying in response to the first common shifting signal LAXFD<0>, the third internal control signal SADRVPCGB and the mat selection signal MATSEL. When the first common level shifter 150A activates the first common shifting signal LAXFD<0> by shifting a level of the first region identification signal LAXF<0> to the first boosted voltage VPP, the fourth level shifting unit 150F may activate the first precharge signal BLEQ_L between the first and second precharge signals BLEQ_L and BLEQ_R in response to the first common shifting signal LAXFD<0> and the fourth internal control signal MATSEL.

Where the second region identification signal LAXF<1> is activated, the second common level shifter 150B activates the second common shifting signal LAXFD<1> by shifting level of the second region identification signal LAXF<1> to the first boosted voltage VPP, the third level shifting unit 150E may activate the second precharge signal SADRVPCG_R for sensing and amplifying between the first and second precharge signals SADRVPCG_L and SADRVPCG_R for sensing and amplifying in response to the second common shifting signal LAXFD<1>, the third internal control signal SADRVPCGB and the mat selection signal MATSEL. When the second common level shifter 150B activates the second common shifting signal LAXFD<1> by shifting a level of the second region identification signal LAXF<1> to the first boosted voltage VPP, the fourth level shifting unit 150F may activate the second precharge signal BLEQ_R between the first and second precharge signals BLEQ_ and BLEQ_R in response to the second common shifting signal LAXFD<1> and the fourth internal control signal MATSEL.

When the first and second region identification signals LAXF<0> and LAXF<1> are activated, the first and second common level shifting units 150A and 150B activate both of the first and second common shifting signals LAXFD<0> and LAXFD<1> by shifting levels of the first and second region identification signals LAXF<0> and LAXF<1> to the first boosted voltage VPP the third level shifting unit 150E may activate both of the first and second precharge signals SADRVPCG_L and SADRVPCG_R for sensing and amplifying in response to the first and second common shifting signals LAXFD<0> and LAXFD<1>, the third internal control signal SADRVPCGB and the mat selection signal MATSEL. When the first and second common level shifting units 150A and 150B activate both of the first and second common shifting signals LAXFD<0> and LAXFD<1> by shifting levels of the first and second region identification signals LAXF<0> and LAXF<1> to the first boosted voltage VPP, the fourth level shifting unit 150F may activate both of the first and second precharge signals BLEQ_L and BLEQ_R in response to the first and second common shifting signals LAXFD<0> and LAXFD<1> and the fourth internal control signal MATSEL.

Then, the first data input/output path circuit 120 may perform precharge operation under the control of the control circuit 150. The operation of the first data input/output path circuit 120, may be described as the power supply unit 120A may drive the pull-up terminal PS and the pull-down terminal NS with bit line precharge voltage VBLP in response to the first precharge signal SADRVPCG_L for sensing and amplifying. The bit line precharging unit 120C may precharge the pair of bit lines BL and BLB to level of the bit line precharge voltage VBLP in response to the first precharge signal BLEQ_L. Therefore, the bit line sense amplifying unit 120B may be disabled and the pair of bit lines BL and BLB may be kept equalized to a level of the bit line precharge voltage VBLP.

Precharge operation the second data input/output path circuit 140 is the same as the first data input/output path circuit 120.

In accordance with the embodiment of the present invention, signals of similar characteristics may be generated by a level shifting circuit and thus a number of the level shifting circuits required by the semiconductor device may be reduced.

While the present invention has been described with respect to the specific embodiments, it will be apparent to those skilled in the art that various changes and modifications may be made without departing from the spirit and scope of the invention as defined in the following claims.

For example, three or more MATS may share the first and second common level shifting sections even though the description discloses that two MATS share the first and second common level shifting sections. The spirit and scope of the present invention may be applied to unit of a bank or to a higher level other than the unit of the MAT.

Further, one region identification signal may be used for selecting one of the two regions other than two region identification signals for selecting one or more of the two regions, that is disclosed as an example in this description.

What is claimed is:

1. A semiconductor device comprising:
   a first level shifter suitable for shifting a level of a region identification signal identifying first and second regions to a preset voltage;
   a plurality of second level shifters suitable for shifting levels of a plurality of internal control signals to the preset voltage; and
   a plurality of logic operators suitable for generating a plurality of first internal assignment signals assigned to the first region and a plurality of second internal assignment signals assigned to the second region in response to a common shifting signal output from the first level shifter and a plurality of individual shifting signals output from the plurality of second level shifters.

2. The semiconductor device of claim 1, wherein the region identification signal includes a bank address for identifying a bank.

3. The semiconductor device of claim wherein the plurality of internal control signals include control signals related to a data input/output path.

4. The semiconductor device of claim 3, wherein the control signals related to the data input/output path include one or more control signals for controlling operation of a bit line sense amplifying unit, a control signal for controlling precharge of a bit line and a control signal for controlling connection between data lines.

5. The semiconductor device of claim 1, wherein the first level shifter is disposed by at least two unit cell arrays.

6. A semiconductor device comprising:
   a first common level shifter suitable for shifting a level of a first region identification signal corresponding to a first region to a preset voltage;
   a second common level shifter suitable for shifting a level of a second region identification signal corresponding to a second region to the preset voltage;
   a plurality of individual level shifters suitable for shifting levels of a plurality of internal control signals to the preset voltage;
   a plurality of logic operators suitable for generating a plurality of first internal assignment signals assigned to the first region and a plurality of second internal assignment signals assigned to the second region by performing logic operations on first and second common shifting signals output from the first and second common level shifters and a plurality of individual shifting signals respectively output from the plurality of second level shifters;
   a first internal circuit disposed in the first region and suitable for performing a preset operation response to the plurality of first internal assignment signals; and
   a second internal circuit disposed in the second region and suitable for performing a preset operation in response to the plurality of second internal assignment signals.

7. The semiconductor device of claim 6, wherein the first and second common level shifters, the plurality of individual level shifters and the plurality of logic operators are disposed in a third region, and
   the third region is disposed between the first and second regions.

8. The semiconductor device of claim 6, wherein the first and second region identification signals include first and second bank addresses for identifying first and second banks.

9. The semiconductor device of claim 6, wherein the plurality of internal control signals include control signals related to a data input/output path.

10. The semiconductor device of claim 9, wherein the control signals related to the data input/output path include one or more control signals for controlling operation of a bit line sense amplifying unit, a control signal for controlling precharge of a bit line and a control signal for controlling connection between data lines.

11. The semiconductor device of claim 6, wherein the first and second common level shifters are disposed by at least two unit cell arrays.

12. A semiconductor memory device comprising:
    first and second unit cell arrays;
    first and second data input/output path circuits corresponding to the first and second unit cell arrays, respectively; and
    a control circuit suitable for generating control signals for controlling the first and second data input/output path circuits,
    wherein the control circuit is disposed between the first and second data input/output path circuits and comprises:
    an input section suitable for receiving an internal assignment signal in response to a selection signal;
    a first level shifter suitable for shifting a level of an output signal of the first input section to a boosted voltage; and
    a first logic operator suitable for generating a first control signal corresponding to the first data input/output path circuit in response to a first common shifting signal and a second control signal corresponding to the second data input/output path circuit in response to a second common shifting signal.

13. The semiconductor memory device of claim 12, wherein control circuit further comprises:
    a second level shifter suitable for shifting a level of a first region identification signal corresponding to the first unit cell array to the boosted voltage; and
    a third level shifter suitable for shifting a level of a second region identification signal corresponding to the second unit cell array to the boosted voltage.

* * * * *